US012035514B2

(12) United States Patent
Kobolla et al.

(10) Patent No.: US 12,035,514 B2
(45) Date of Patent: Jul. 9, 2024

(54) LIQUID COOLING DEVICE FOR THE ARRANGEMENT OF A POWER SEMICONDUCTOR DEVICE

(71) Applicant: SEMIKRON ELEKTRONIK GMBH & CO. KG, Nuremberg (DE)

(72) Inventors: Harald Kobolla, Seukendorf (DE); Rainer Popp, Petersurach (DE); Christian Zeller, Pommersfelden (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 212 days.

(21) Appl. No.: 17/881,929

(22) Filed: Aug. 5, 2022

(65) Prior Publication Data

US 2023/0038316 A1 Feb. 9, 2023

(30) Foreign Application Priority Data

Aug. 6, 2021 (DE) .......................... 102021120529.8

(51) Int. Cl.
*H05K 7/20* (2006.01)
(52) U.S. Cl.
CPC ..... *H05K 7/20927* (2013.01); *H05K 7/20272* (2013.01)
(58) Field of Classification Search
CPC . H01L 23/473; H01L 21/4871; H01L 23/367; H01L 23/3672; H01L 23/49827; H01L 25/0655; H05K 7/20254; H05K 7/20927; H05K 7/20272; F28F 13/12; F28F 1/40; F28F 1/003; F28F 1/022; F28F 3/12; F28D 15/0233; F28D 15/04; F28D 7/04; F25B 1/053
See application file for complete search history.

(56) References Cited

U.S. PATENT DOCUMENTS

| 4,883,117 | A | * | 11/1989 | Dobbs | ....................... F28D 7/04 165/DIG. 437 |
| 2005/0195574 | A1 | * | 9/2005 | Chiba | ................... H01L 23/473 361/709 |
| 2023/0317560 | A1 | * | 10/2023 | Uhlemann | ............ H01L 25/072 361/699 |

FOREIGN PATENT DOCUMENTS

| CN | 000201467616 U | 5/2010 |
| DE | 19747321 A1 | 5/1999 |
| DE | 102006044024 B3 | 3/2008 |

(Continued)

OTHER PUBLICATIONS

Schmidt et al., Liquid cooler for power semiconductor components, English translation DE19747321 (Year: 1999).*

(Continued)

*Primary Examiner* — Michael A Matey
(74) *Attorney, Agent, or Firm* — Andrew F. Young; NOLTE LACKENBACH SIEGEL

(57) ABSTRACT

A liquid cooling device with a main body has a planar surface for the arrangement of a power semiconductor device. This main body has a first end face and a second end face opposite said first one, and a plurality of tubular cooling recesses extending from the first to the second end face. A first swirling element arranged in an associated cooling recess, wherein the swirling element has an operative section arranged within the associated cooling recess and a locking section, wherein the locking section interacts with a locking abutment and/or with a further swirling element, and therefore prevents rotation of the operative section in the associated recess.

13 Claims, 3 Drawing Sheets

(56) References Cited

FOREIGN PATENT DOCUMENTS

| DE | 102015115261 | A1 | * | 8/2016 | | |
|----|--------------|----|---|--------|---|---|
| DE | 102018129160 | A1 | * | 5/2020 | ............... | F28D 1/03 |
| DE | 102020125063 | A1 | * | 3/2022 | | |
| EP | 2172731 | A2 | * | 4/2010 | ................ | F28F 3/12 |
| EP | 2709115 | A1 | | 3/2014 | | |

OTHER PUBLICATIONS

German Patent No. 102021120529.8, Examination Report dated Jun. 22, 2022, 6 pages—German, 6 pages—English.

* cited by examiner

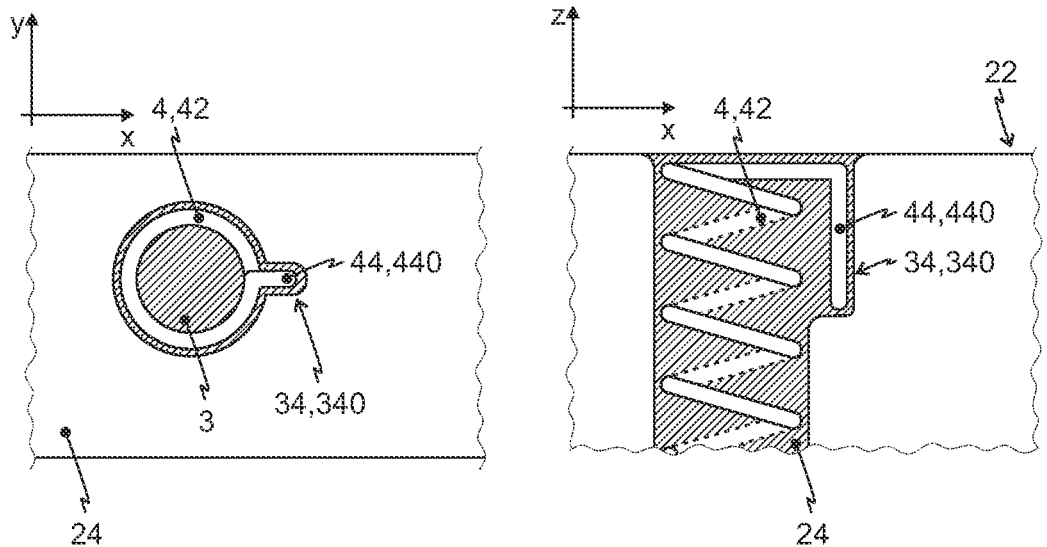
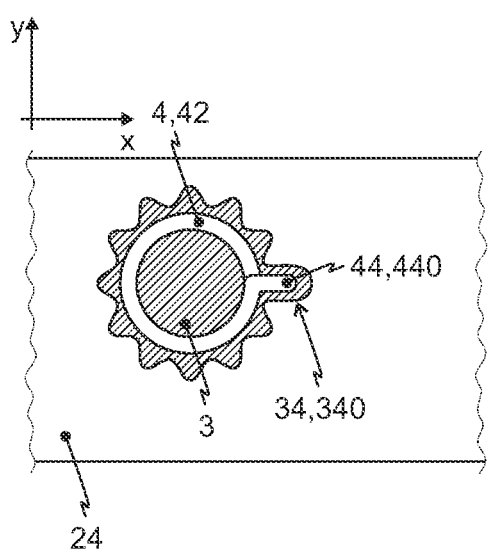
Fig. 5
Fig. 6

LIQUID COOLING DEVICE FOR THE ARRANGEMENT OF A POWER SEMICONDUCTOR DEVICE

CROSS REFERENCE TO RELATED APPLICATIONS

This application relates to and claims priority from DE 10 2021 120 529.8 filed Aug. 6, 2021, the entire contents of which are incorporated herein fully by reference.

FIGURE SELECTED FOR PUBLICATION

FIG. 3.

BACKGROUND OF THE INVENTION

Field of the Invention

The invention describes a liquid cooling device with a main body having a planar surface for the arrangement of a power semiconductor device, wherein this main body has a first end face and a second end face opposite this first one. The liquid cooling device also has a plurality of tubular cooling recesses extending from the first to the second end face. Arranged in these cooling recesses are swirling elements, which swirl a cooling liquid flowing through in such a way that the cooling action is intensified.

Description of the Related Art

DE 197 47 321 A1 discloses, as prior art, a liquid cooler for power semiconductor components having a highly thermally conductive metallic heatsink which has a plurality of tubes to receive liquid cooling media, which has a spiral positioned in each tube and the external dimensions of the turns of which are the same size as the clear diameter of the tubes. As a result of the installation of spirals into the tubes of the liquid cooler introduced for the cooling media to flow through, a reduction in the thermal resistance by approximately one half as compared with similar types of cooling devices without inserted spirals is achieved.

ASPECTS AND OBJECTS OF THE INVENTION

With knowledge of the prior art, the invention is based on the object of developing the liquid cooling device in such a way that an anti-rotation safeguard of the swirling elements which can be produced reliably and nevertheless simply is formed.

According to the invention, this object is achieved by a liquid cooling device with a main body having a planar surface for the arrangement of a power semiconductor device, wherein this main body has a first end face and a second end face opposite this first one, having a plurality of tubular cooling recesses extending from the first to the second end face, having a first swirling element arranged in an associated cooling recess, wherein the swirling element has an operative section arranged within the associated cooling recess and a locking section, wherein the locking section interacts with a locking abutment and/or with a further swirling element, and therefore prevents rotation of the operative section in the associated recess.

Here, the locking section can of course connect the first and second swirling elements and, at the same time, be arranged in a locking abutment.

It may be advantageous if the locking section is designed as a first straight or angled pin section, which is arranged in a locking recess which forms the locking abutment. Here, in addition, the locking recess can be formed on the first end face of the main body or in an opposite side of a first collecting body, wherein the first collecting body is arranged with its opposite side on the first end face. The locking recess can have a section which extends parallel to the first end face, and preferably a further section which extends at right angles thereto.

By contrast, it may also be advantageous if the locking recess is formed as an, in particular additional, deepening recess in the associated cooling recess. Here, this deepening recess can preferably be formed only in a portion of the cooling recess.

Specifically, it may be preferred for the respective locking sections of the first and further swirling elements, preferably arranged in adjacent cooling recesses, to be formed as a second, straight or curved, connecting pin section connecting the two swirling elements.

In principle, it may be preferred if the cooling recesses extend parallel to the planar surface.

It may further be preferred for the cooling recesses to have a round cross section and, here, in particular, to have a smooth surface or a surface with a plurality of pins reaching as far as the center or a radial serration. Here, a pin or a notch of the serration itself can form the locking abutment.

In particular, it may be advantageous if the operative section of the swirling element is helical. Here, the central axis of the swirling element can coincide with the central axis of the associated cooling recess. In addition, at the same time or alternatively, respective adjacent swirling elements can have operative sections of the helix with a different direction of rotation, rotating to the right or to the left.

Basically, it is advantageous if the external diameter of the operative section corresponds to the clear diameter of the cooling recess.

Of course, if this is not ruled out explicitly or per se or contradicts the idea of the invention, the features respectively mentioned in the singular may be present many times in the liquid cooling device according to the invention.

It goes without saying that the various configurations of the invention can be implemented singly or in any desired combinations in order to achieve improvements. In particular, the features mentioned and explained above and in the following can be used not only in the combinations indicated but also in other combinations or on their own without departing from the scope of the present invention.

Further explanations of the invention, advantageous details and features can be gathered from the following description of the exemplary embodiments of the invention illustrated schematically in FIGS. 1 to 6 or from respective parts thereof.

The above and other aspects, features, objects, and advantages of the present invention will become apparent from the following description read in conjunction with the accompanying drawings, in which like reference numerals designate the same elements.

BRIEF DESCRIPTION OF THE DRAWINGS

FIG. 5 shows two views of a detail of a third configuration of a liquid cooling device according to the invention.

FIG. 6 shows a modified refinement of this third configuration.

DETAILED DESCRIPTION OF THE PREFERRED EMBODIMENTS

Figure 1:
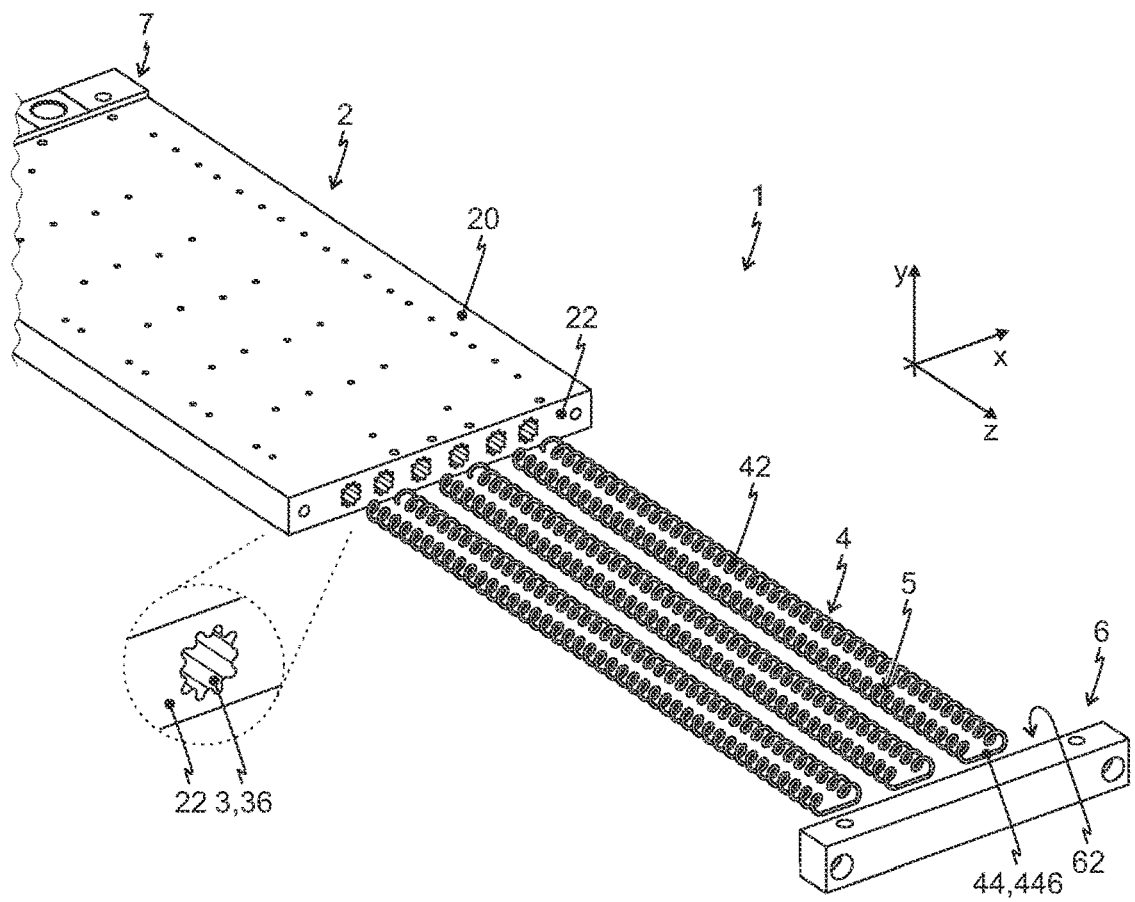
FIGS. 1 and 2 show a first configuration of a liquid cooling device according to the invention in a three-dimensional view.
Figure 2:
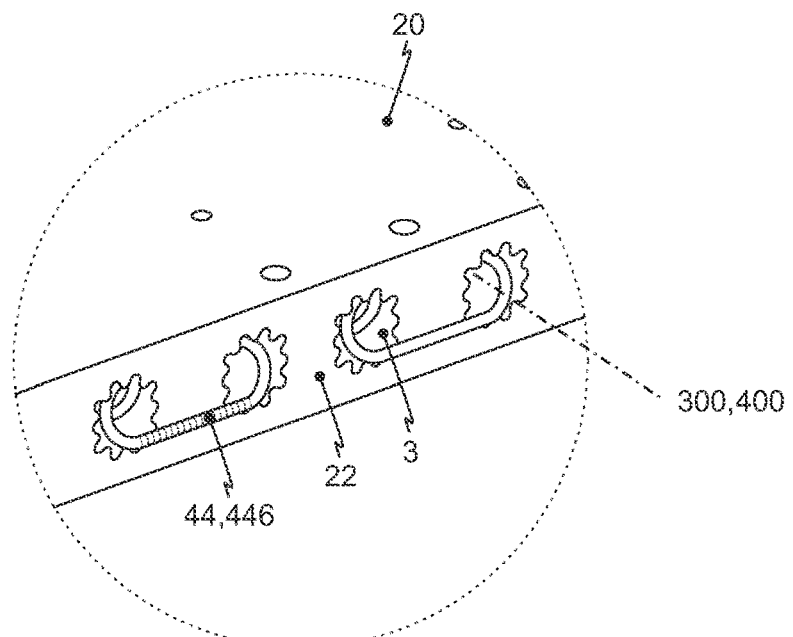

FIGS. 1 and 2 show a first configuration of a liquid cooling device 1 according to the invention in a three-dimensional view. This liquid cooling device 1 has a planar surface 20 for the arrangement of a plurality of power semiconductor devices, for example half-bridge power semiconductor modules. This planar surface 20 forms a main surface of a main body 2 of the liquid cooling device 1. At right angles to this planar surface 20, here a first end face 22 and a second end face opposite and parallel thereto are arranged on the first narrow side of the main body 2.

The main body 20 also has a plurality of tubular cooling recesses 3. These extend from the first to the second end face 22 and are aligned parallel to the planar surface 20. The outline of the cross section of these cooling recesses 3 is round, having a radial serration 36 in this configuration.

As already known in principle from the prior art, a first swirling element 4 is arranged in each of the cooling recesses 3, having an operative section 42 which is helical. The central axis 400 of the first swirling element 4 here coincides with the central axis 300 of the associated cooling recess 3. At the same time, the diameter of the operative section 42 is chosen such that it corresponds to the clear diameter of the cooling recess 3. The operative section 42 therefore rests radially on the ends of the serrations that protrude into the inner region of the cooling recess 3.

The first swirling element 4 and, in particular, its operative section 42 are formed from a metallic material which, ideally, is the same as that of the main body 2 of the liquid cooling device 1. In this configuration, the main body 2 consists of aluminum, and the first swirling element 4 likewise consists of aluminum or an aluminum alloy with at least 60% aluminum.

The material of the helical operative section 42 here has a round, oval or preferably rectangular cross section. The operative section 42 is used to swirl cooling liquid flowing through the cooling recess 3, i.e., to prevent laminar flow, as a result of which the transmission of heat from the main body 2 to the cooling liquid is improved.

In the practical application, as a result of requirements related to production, oscillations or further critical rotations of the operative section 42 in the cooling recess 3 result. According to the invention, these are prevented by the preferably one-piece further development of the first swirling element 4, which, in addition to the operative section 42, is supplemented by a locking section 44, preferably already formed during the production of the first swirling element 4.

In this first configuration, the locking section 44 is formed by a connecting pin section 446 between a first swirling element 4 and a further swirling element 5. The two swirling elements 4,5 thus cooperate via the locking section 44 and prevent rotation of the respective operative section 42 in the associated cooling recess 3. In addition, here the operative section 42 of the swirling element 4 has a helical course with a first direction of rotation of the helix, rotating to the left here when viewed in the negative z direction, while the operative section of the further swirling element 5 has a helical course with a second direction of rotation of the helix, rotating to the right here when viewed in the negative z direction.

Also illustrated are two collecting bodies 6,7 of the liquid cooling device 1, which each have a cooling liquid inlet or outlet and a collecting recess. For example, cooling liquid flows through the inlet of the first collecting body 6 into its collecting recess and from the latter into the respective cooling recesses 3. The cooling liquid emerges from the respective cooling recesses 3 into the collecting recess of the second collecting body 7 and from there flows through the cooling liquid outlet out of the liquid cooling device 1 again. For this purpose, the first collecting body 6 is arranged with its opposite side 62 on the first end face 22 of the main body 2, and the second collecting body 7 is arranged with its opposite side 62 on the second end face of the main body 2.

Figure 3:
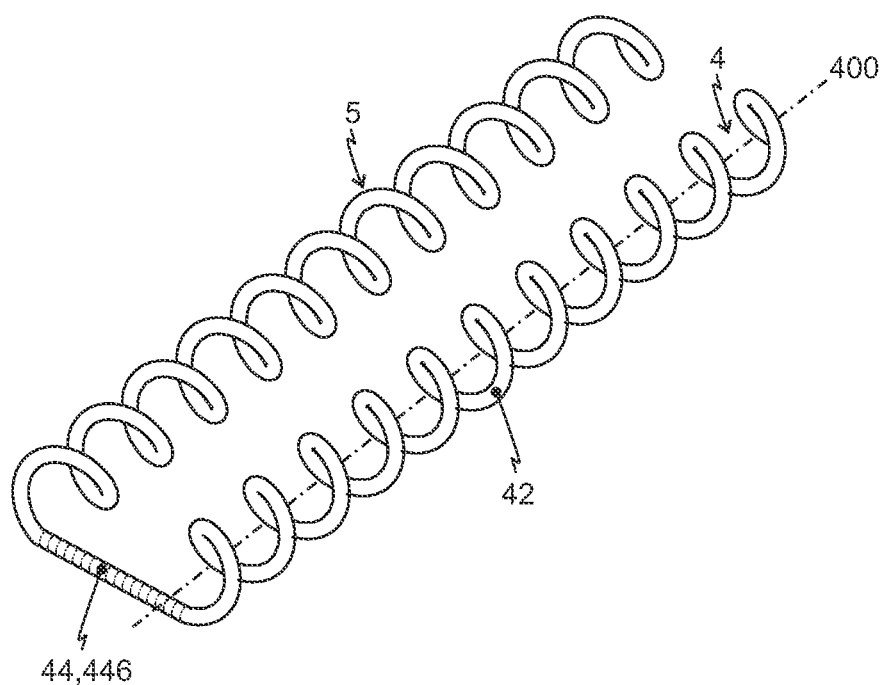
FIG. 3 shows the two swirling elements belonging to the first liquid cooling device.

FIG. 3 shows the two swirling elements 4,5 belonging to the liquid cooling device 1 and their connecting pin section 446.

Figure 4:
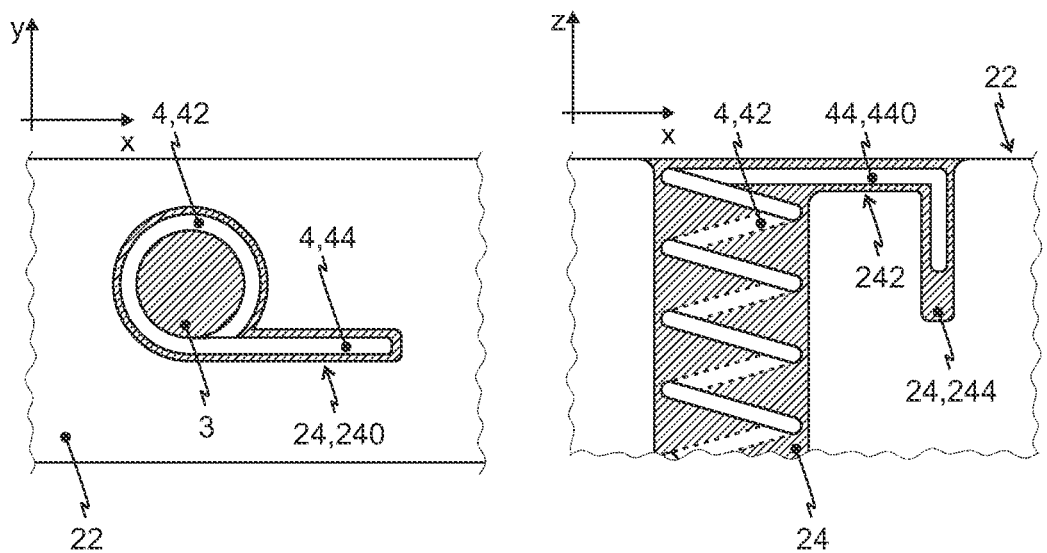
FIG. 4 shows two views of a detail of a second configuration of a liquid cooling device according to the invention.

FIG. 4 shows two views of a detail of a second configuration of a liquid cooling device 1 according to the invention, wherein in each case a detail of the main body 2 and a first swirling element 4 arranged in a cooling recess 3 with a circular cross section is illustrated.

Here, starting tangentially from the cooling recess 3, a trench-like recess which, here, forms a locking recess 240 as a configuration of the locking abutment 24, is arranged in the surface of the end face 22 and ends in an additional deepening of the trench.

The operative section 42 of the swirling element 4 is adjoined in one piece and tangentially relative to the central axis by the locking section 44, which is L-shaped here. Here, the first leg, a section 242, of the "L" extends parallel to the end face, and the second leg of the "L" extends at right angles thereto and in the direction of the operative section 42, i.e., in the negative z direction here.

This locking section 44 of the swirling element 4, L-shaped here, is arranged in this locking recess 240, wherein the angled pin section 440 end of the locking section 44 is arranged in the additional deepening 244. The whole of the first swirling element 4 thus does not protrude out of the end face 22 of the main body 2 of the liquid cooling device 1, that is to say in the z direction.

As a result of the arrangement of the locking section 44 with the locking abutment 24, rotation of the operative section 42 in the associated cooling recess 3 is prevented.

FIG. 5 shows two views of a detail of a third configuration of a liquid cooling device 1 according to the invention, wherein, once more, in each case a detail of the main body 20 and a swirling element 4 arranged in a cooling recess 3 are illustrated.

The cooling recess 3 here once more has a basically circular cross section. However, an additional deepening recess, that is to say a trench, is arranged in this circular cross section, extends radially outwards and forms a locking recess 340 as a configuration of the locking abutment 34. A portion of this trench, starting from the first end face 22, reaches into the cooling recess 3.

The operative section 42 of the first swirling element 4 is adjoined in one piece and tangentially relative to the central axis by the locking section 44, which is L-shaped here. Here, the first leg of the "L" extends parallel to the end face 20, and the second leg of the "L" extends at right angles thereto and in the direction of the operative section 42, i.e., in the negative z direction here.

The locking section 44, more accurately its second leg, is arranged in the locking recess 340 and therefore in the cooling recess 3 itself. The whole of the first swirling element 4 thus does not protrude out of the end face 22 of the main body 2 of the liquid cooling device 1, that is to say in the z direction.

FIG. 6 shows a modified refinement of this third configuration. The cooling recess 3 here has a radial serration 36, in which one of the deepenings is more highly pronounced and thus simultaneously forms the locking recess 340.

LIST OF REFERENCE SYMBOLS

1 Liquid cooling device
2 Main body
20 Planar surface
22 First end face
24 Locking abutment
240 Locking recess
242 Section of 240
244 Additional deepening of 240
3 Cooling recess
34 Locking abutment
36 Serration
300 Central axis
340 Locking recess
4 First swirling element
42 Operative section
44 Locking section
400 Central axis
440 Angled pin section
446 Connecting pin section
5 Further swirling element
6 First collecting body
62 Opposite side
7 Second collecting body.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

The invention claimed is:

1. A liquid cooling device, for the arrangement of a power semiconductor device in an assembly, comprising: a main body having a planar surface for said assembly with said power semiconductor device; the main body has a first end face and a second end face opposite the first end face; a plurality of tubular cooling recesses extending from the first end face to the second end face; a first turbulence body arranged in a respective associated cooling recess; the first turbulence body has an active section arranged inside the associated cooling recess and a locking section and whereby the locking section interacts with one of a locking counter-bearing and with a further turbulence body and thus preventing rotation of the active section in the associated cooling recess.

2. The liquid cooling device, according to claim 1, wherein: the locking section is one of a first straight section or an angled pin section arranged in a locking recess, which forms the locking abutment.

3. The liquid cooling device, according to claim 2, wherein: the locking recess is formed on the first end face of the main body or in a opposite side of a first collecting body; and wherein the first collecting body is arranged with its opposite side on the first end face.

4. The liquid cooling device, according to claim 3, wherein: the locking recess has a section, which extends parallel to the first end face.

5. The liquid cooling device, according to claim 2, wherein: the locking recess is formed as a recess shaped as an additional deepening recess in the associated cooling recess.

6. The liquid cooling device, according to claim 5, wherein: the additional deepening recess is formed only in a partial section of the cooling recess.

7. The liquid cooling device, according to claim 1, wherein: the respective locking sections of the first and further turbulence bodies, are arranged in respective adjacent cooling recesses; and a second connecting pin section that connects both turbulence bodies and is one of a straight section or a curved section.

8. The liquid cooling device, according to claim 1, wherein: the plurality of cooling recesses are arrayed parallel to the planar surface.

9. The liquid cooling device, according to claim 1, wherein: the cooling recesses have a substantially round cross-section having one of a smooth surface, a surface with a plurality of studs extending radially to the center point, and a radial serrated profile.

10. The liquid cooling device, according to claim 1, wherein: the active section of the turbulence body has a helical shape.

11. The liquid cooling device, according to claim 10, wherein: a center axis of the turbulence body coincides with a center axis of the associated cooling recess.

12. The liquid cooling device according to claim 11, wherein: each adjacent alternating turbulence body has active sections with a different direction of rotation of the helix.

13. The liquid cooling device, according to claim 11, wherein: the outer diameter of the active section corresponds to the free diameter of the cooling recess.

* * * * *